• (12) United States Patent
Chiu

(10) Patent No.: US 7,959,117 B2
(45) Date of Patent: Jun. 14, 2011

(54) SEAT STRUCTURE FOR SUPPORTING AN ASSEMBLY FROM UNDERNEATH

(75) Inventor: Hsien-Chih Chiu, Hsinchu County (TW)

(73) Assignee: Gemtek Technology Co., Ltd., Hsinchu (TW)

( * ) Notice: Subject to any disclaimer, the term of this patent is extended or adjusted under 35 U.S.C. 154(b) by 217 days.

(21) Appl. No.: 12/188,690

(22) Filed: Aug. 8, 2008

(65) Prior Publication Data

US 2010/0001150 A1      Jan. 7, 2010

(30) Foreign Application Priority Data

Jul. 3, 2008   (TW) .............................. 97211806 U

(51) Int. Cl.
*F16M 11/20*    (2006.01)
(52) U.S. Cl. .................. 248/188.1; 248/188.8; 267/159; 267/161
(58) Field of Classification Search ............... 248/188.1, 248/188.2, 188.7, 188.8, 188.9, 346.05; 267/159, 267/161
See application file for complete search history.

(56) References Cited

U.S. PATENT DOCUMENTS 5,169,115 A * 12/1992 Chung Hsiang .............. 248/677
6,639,158 B2 * 10/2003 Germanton ................... 177/238
7,155,903 B2 * 1/2007 Ishiwa ........................... 60/322

FOREIGN PATENT DOCUMENTS

TW            324538         1/1998
* cited by examiner

*Primary Examiner* — A. Joseph Wujciak, III
(74) *Attorney, Agent, or Firm* — Rosenberg, Klein & Lee

(57) ABSTRACT

A seat structure is provided for disposing below an assembly in order to support the assembly from underneath. The assembly has a base portion formed with an opening. The seat structure includes a bottom seat for placing within the opening in the base portion and a plurality of flexible connecting elements. Each flexible connecting element includes an outer bent end connected to a periphery confining the opening in the base portion, an inner bent end connected to the bottom seat and a main body between the outer and inner bent ends. The vibration of the assembly is absorbed by the seat structure to provide stability to the assembly.

9 Claims, 3 Drawing Sheets

# SEAT STRUCTURE FOR SUPPORTING AN ASSEMBLY FROM UNDERNEATH

FIELD OF THE INVENTION

The present invention relates to a seat structure, and more particularly to a seat structure for disposing below an electronic device or assembly so as to support the same from underneath and to absorb the vibration caused due to operation of the electronic device.

BACKGROUND OF THE INVENTION

Since the function of an electronic device increases, there should be ways to absorb vibration of the electronic device during the operation, since the vibration or inclined position of the device may affect the function ability thereof.

A seat structure is generally implemented in order to eliminate the aforementioned disadvantage. The seat structure can be an independent element or is coupled to the bottom of the assembly via a fastener bolt. It happens that the manufacturers of the assembly and the seat structure have no communication with each other so that the seat structure's manufacturer considers the structure design only in view of the available material to facilitate in the manufacturing process. In other words, one manufacturer will not consider its product is applied in combination with the other product.

There are techniques that couple the seat structure to an outer casing of the assembly to absorb vibration and to provide stability of the assembly. If we can utilize the resilient structure existing in the assembly for serving as the seat structure, the material and cost for constructing some elements in the seat structure can be economized in addition to providing resilient effect to the assembly. According to ROC Patent NO 00324538, a seat structure is coupled with the circular resilient structure of the assembly casing to achieve the object of minimizing the components in the seat structure. The preceding arrangement improves the overall resilient effect of the assembly.

The above-stated resilient structure includes an upwardly curved portion, which occupies a relatively large space in the assembly, thereby causing difficulty to design the assembly in thin and compact size. Moreover, in case the assembly encounters a relatively large impact, the resilient structure itself cannot absorb the impact, thereby tending to damage.

Therefore, the object of the present invention is to provide a seat structure that can eliminate the disadvantages encountered during use of the prior art ones.

SUMMARY OF THE INVENTION

The object of the present invention is to provide a seat structure, which requires lesser material and manufacturing expense and which provides a fine stability to absorb vibration of an assembly equipped with the seat structure.

The seat structure of the present invention is adapted to be disposed below an assembly so as to support the assembly from underneath. The assembly has a base portion formed with an opening. The seat structure accordingly includes a bottom seat and a plurality of flexible connecting elements.

The bottom seat is to be placed within the opening in the base portion. Each flexible connecting element includes an outer bent end connected to a periphery confining the opening in the base portion, an inner bent end connected to the bottom seat and a main body between the outer and inner bent ends.

The bottom seat further includes a carrier disc and a support leg. The carrier disc has an outer peripheral portion connected to the inner bent end of each of the flexible connecting elements. The support leg is attached to a bottom side of the carrier disc and is adapted to be disposed on a support surface in order to support the assembly from underneath. Preferably, the support leg and the carrier disc are fabricated by an injection process such that the support leg is integrally formed with the bottom side of the carrier disc.

Since a certain part projecting from an outer casing of the assembly serves as the bottom seat and the flexible connecting elements of the seat structure of the present invention, the cost for material and construction is minimized in addition to providing a fine stability to absorb the vibration caused during operation of the assembly.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 1:
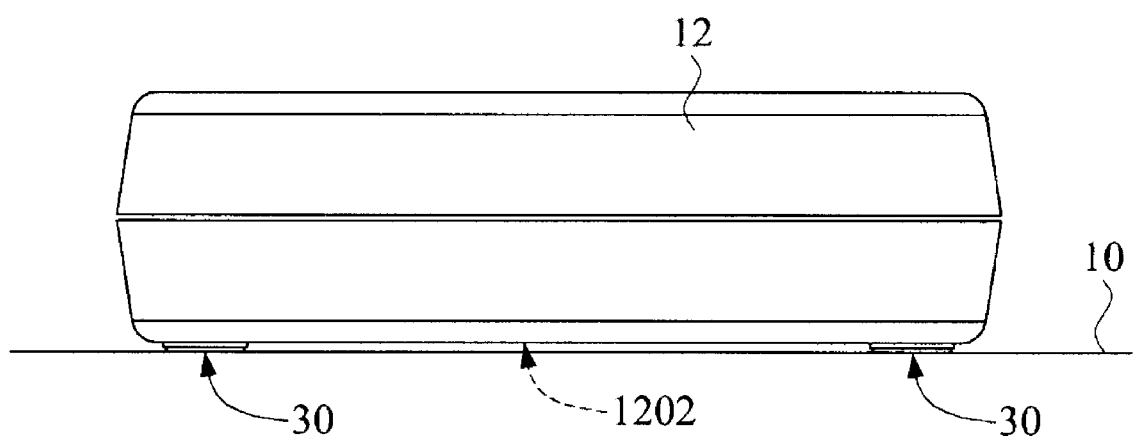
FIG. 1 is a perspective view of a seat structure of the present invention supporting an assembly from underneath.

FIG. 1 is a perspective view of a seat structure 30 of the present invention for supporting an electronic assembly or device 12 from underneath. The seat structure 30 of the present invention is disposed below a base portion 1202 of the assembly 12 in order to absorb the vibration caused during operation of the assembly 12.

Figure 2:
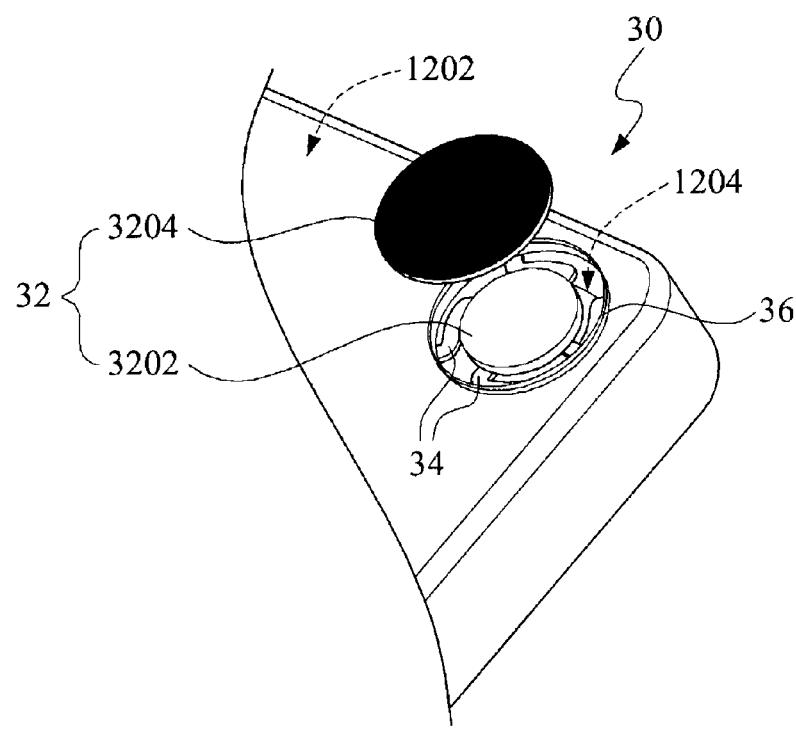
FIG. 2 shows an exploded view of the seat structure of the present invention, wherein the assembly supported is turned upside down to illustrate attachment of the seat structure thereto.
Figure 3:
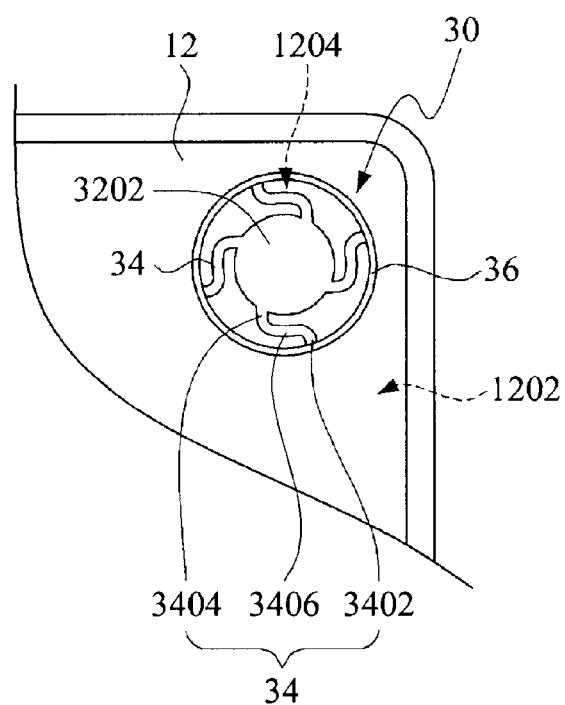
FIG. 3 is an enlarged view of a carrier disc and a bottom seat of the seat structure of the present invention.

Referring to FIGS. 2 and 3, wherein FIG. 2 is an exploded view of the seat structure of the present invention, in which, the assembly 12 is turned upside down to illustrate attachment of the present seat structure 30 thereto. FIG. 3 is an enlarged view of a carrier disc and a bottom seat of the seat structure of the present invention. The base portion 1202 of the assembly 12 is formed with an opening 1204. In case the assembly 12 has four bottom corners, there should be four openings 1204 in the base portion 1202. Each seat structure 30 of the present invention includes a bottom seat 32 and a plurality of flexible connecting elements 34.

The bottom seat 32 is to be placed within the opening 1204 in the base portion 1202. Each flexible connecting element 34 includes an outer bent end 3402 connected to a periphery confining the opening 1204 in the base portion 1202, an inner bent end 3404 connected to the bottom seat 32 and a main body 3406 between the outer and inner bent ends 3402, 3404. The outer and inner ends 3402, 3404 are bent relative to the main body 3406 in order to increase a total length of the connecting element 34, which, in turn, provides a better flexibility.

In this embodiment, each of the openings 1204 in the base portion 1202 is constructed in circular shape (or circle-shaped) in order to receive the external impact force uniformly. The bottom seat 32 of the present invention is constructed to have generally circular (or circle-shaped) in order to complement with the shape of the opening 1204. Each seat structure 30 generally has three to four flexible connecting elements 34.

The bottom seat 32 further includes a carrier disc 3202 and a support leg 3204 made from flexible material. The carrier disc 3202 has an outer peripheral portion connected to the inner bent end 3404 of each of the flexible connecting elements 34. The support leg 3204 is attached to a bottom side of the carrier disc 3202 and is adapted to be disposed on a support surface 10 in order to support the assembly 12 from underneath. Preferably, the support leg 3204 and the carrier disc 3202 are fabricated by an injection process such that the support leg 3204 is integrally formed with the bottom side of the carrier disc 3202.

Referring to FIG. 2, the assembly 12 has a retention flange 36 extending downwardly from the periphery confining the opening 1204 in the base portion 1202 for enclosing a top section of the support leg 3204, thereby enhancing stability of the assembly 12 on the support leg 3204. Under this condition, the support leg 3204 is prevented from slipping on the support surface 10.

The vibration of the assembly 12 during operation of the same is absorbed by total flexibility of the support leg 3204 and the flexible connecting elements 32 so that no damage will be done on the assembly 12. Since a majority of the components constituting the elements of the seat structure of the present invention is integrally formed with the outer casing of the assembly 12, there is little tolerance such that the assembly 12 hardly inclined relative to the support surface 10. Due to this reason, the seat structure of the present invention should be used for supporting a high precise electronic assembly. In other words, the seat structure of the present invention can be designed in compact size also.

Figure 4:
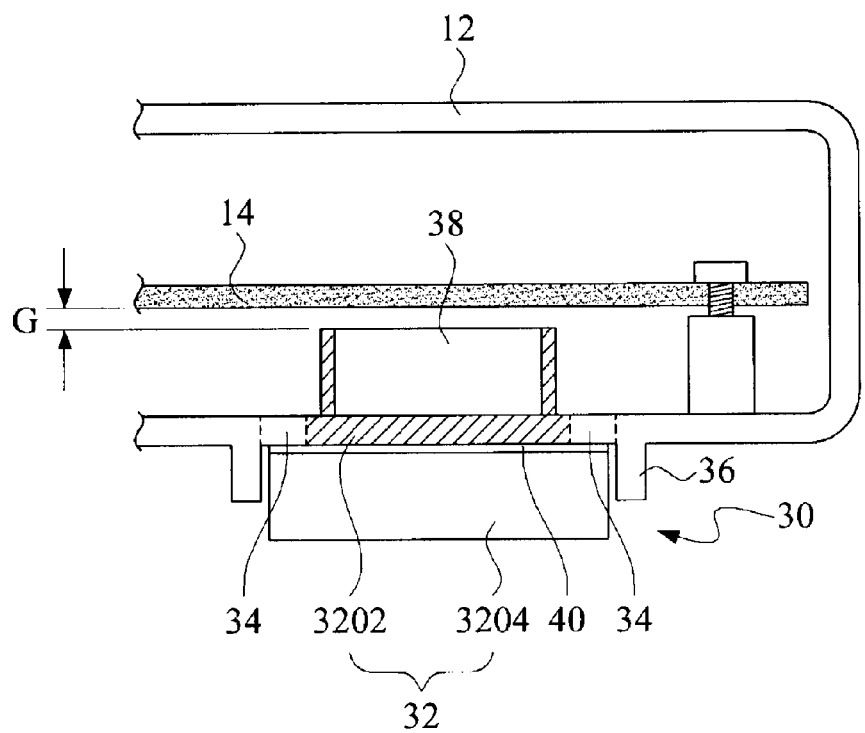
FIG. 4 is a fragmentary view to illustrate how the seat structure of the present invention supports the assembly from underneath.

FIG. 4 is a fragmentary view to illustrate how the seat structure of the present invention supports the assembly from underneath. The seat structure 30 of the present invention further includes an adhesive layer 40 via which the support leg 3204 is attached to the bottom side of the carrier disc 3202. Alternately, the support leg 3204 and the carrier disc 3202 are fabricated by an injection process such that the support leg 3204 is integrally formed with the bottom side of the carrier disc 3202 without the adhesive layer 40.

The assembly 12 further has a bottom plate 14 (such as a printed circuit board) disposed within an interior of the outer casing above the base portion 1202. The seat structure 30 further includes a stop member 38 seated on a top side of the bottom seat 32, is disposed below and spaced from the bottom plate 14 of the assembly by a gap G that defines a deformation range of the bottom seat 32 such that the bottom seat 32 deforms within the gap G in order to absorb vibration of the assembly 12. In case the assembly 12 is impacted with a dead load, the flexible connecting elements 34 will deform to absorb the vibration. Furthermore, in case the assembly 12 is impacted excessively (beyond the dead load), the flexible connecting elements 34 will suffer from material fatigue and tend to damage. Thus, when the assembly 12 is impacted beyond the dead load, the bottom plate 14 descends downward and collides against the support leg 3204, wherein the support leg 3204 deforms with the gap G so that no damage will be caused to the flexible connecting elements 34.

Figure 5:
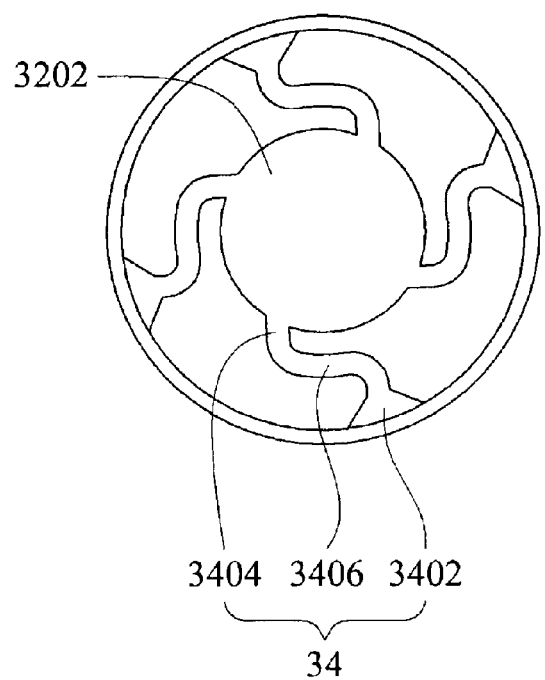
FIG. 5 shows a modified flexible connecting element employed in the seat structure of the present invention.

FIG. 5 shows a modified flexible connecting element employed in the seat structure of the present invention. In this embodiment, the outer bent end 3402 expands gradually from the main body 3406 toward the periphery confining the opening 1204 in the base portion 1202. Since the adjoining area between the outer bent end 3402 and the periphery confining the opening 1204 in the base portion 1202 is liable to snap easily. Thus, the cross-section of each connecting element 34 is thickened at the outer bent end 3402 so as to provide stable connection of the connecting element 34 to the opening 1204.

In the seat structure 30 of the present invention, a certain part projecting from an outer casing of the assembly 12 serves as the bottom seat 12 and the flexible connecting elements 34 of the seat structure 30 of the present invention, the cost for material and construction is minimized in addition to providing a fine stability to absorb the vibration caused during operation of the assembly.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A seat structure for supporting an electric device from underneath, the electric device having a base portion formed with an opening, the seat structure comprising:
    a bottom seat for placement within the opening in the base portion; and
    a plurality of flexible connecting elements, each including an outer bent end connected to a periphery confining the opening in the base portion, an inner bent end connected to said bottom seat and a main body between said outer and inner bent ends;
    wherein said bottom seat further includes:
        a carrier disc having an outer peripheral portion connected to said inner bent end of each of said flexible connecting elements, and
        a support leg attached to a bottom side of said carrier disc and adapted to be disposed on a support surface in order to support the electric device from underneath.

2. The seat structure according to claim 1, wherein the electric device has a retention flange extending downwardly from the periphery confining the opening in the base portion for enclosing a top section of said support leg, thereby enhancing stability of the assembly on said support leg.

3. The seat structure according to claim 2, wherein said support leg is made from flexible material.

4. The seat structure according to claim 1, further comprising an adhesive layer via which said support leg is attached to said bottom side of said carrier disc.

5. The seat structure according to claim 1, wherein said support leg and said carrier disc are fabricated by an injection process such that said support leg is integrally formed with said bottom side of said carrier disc.

6. The seat structure according to claim 1, wherein the electric device includes an outer casing defining the base portion, which is formed integrally with said flexible connecting elements.

7. The seat structure according to claim 1, wherein said outer bent end expands gradually from said main body toward the periphery confining the opening in the base portion.

8. The seat structure according to claim 1, wherein the opening in the base portion is circle-shaped, said bottom seat being circle-shaped in order to complement with the opening in the base portion.

9. The seat structure according to claim 1, wherein the electric device further has a bottom plate disposed within an interior thereof above the base portion, the seat structure further comprising a stop member seated on a top side of said bottom seat, disposed below and spaced from the bottom plate of the assembly by a gap that defines a deformation range of said bottom seat such that said bottom seat deforms within said gap in order to absorb vibration of the electric device.

* * * * *